(12) United States Patent
Lin

(10) Patent No.: US 6,943,372 B2
(45) Date of Patent: Sep. 13, 2005

(54) TOP EMISSION ACTIVE MATRIX OLED AND FABRICATING METHOD THEREOF

(75) Inventor: Chiao-Ju Lin, Taichung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/250,173

(22) Filed: Jun. 10, 2003

(65) Prior Publication Data

US 2004/0135148 A1 Jul. 15, 2004

(30) Foreign Application Priority Data

Jan. 10, 2003 (TW) .......................................... 92100474

(51) Int. Cl.$^7$ .......................... H01L 33/00; H01L 27/01
(52) U.S. Cl. .............................. 257/59; 257/72; 257/98; 257/99; 257/347
(58) Field of Search .............................. 257/40, 59, 66, 257/72, 79, 81, 83, 84, 91, 98, 99, 102, 103, 347, 350, 359, 700, 758, E21.133, E21.413, E21.414, E21.703, E29.278, E29.279

(56) References Cited

U.S. PATENT DOCUMENTS

| 6,117,529 A | * | 9/2000 | Leising et al. ............... 428/209 |
| 6,690,434 B1 | * | 2/2004 | Yamazaki et al. ............ 349/42 |
| 2002/0030193 A1 | * | 3/2002 | Yamazaki et al. ............ 257/98 |
| 2003/0116768 A1 | * | 6/2003 | Ishikawa ...................... 257/79 |

* cited by examiner

Primary Examiner—Minhioan Tran
Assistant Examiner—Thomas L. Dickey
(74) Attorney, Agent, or Firm—Jiang Chyun IP office

(57) ABSTRACT

A top emission active matrix organic light-emitting display device is provided. The display device has a metallic-shielding layer underneath an anode layer so that light from an organic light-emitting layer is prevented from penetrating into the channel layer of a thin film transistor to induce a photoelectric leakage current. The metallic shielding layer also permits the extension of the anode layer into area above the thin film transistor so that light-emitting area of each pixel structure is increased. High conductivity of the shielding layer is also utilized to boost the electrical conductivity of the anode layer so that the device carries a uniform current resulting in a longer working life.

20 Claims, 2 Drawing Sheets

TOP EMISSION ACTIVE MATRIX OLED AND FABRICATING METHOD THEREOF

CROSS REFERENCE TO RELATED APPLICATIONS

This application claims the priority benefit of Taiwan application serial no. 92100474, filed on Jan. 10, 2003.

BACKGROUND OF INVENTION

1. Field of Invention

The present invention relates to an organic light-emitting display (OLED) device and fabricating method thereof. More particularly, the present invention relates to a top emission active matrix OLED device and fabricating method thereof.

2. Description of Related Art

Organic light-emitting display (OLED) is a highly efficient electrical-to-photonic conversion device. Common applications of the OLED include indicator light, display panel and the light-emitting portion of an optical read/write head. Because OLED devices have special properties including no viewing angle restrictions, easy to fabricate, low production cost, high response, wide operating temperature range and full coloration, the OLED device is the preferred display for most multi-media systems.

At present, one particular type of OLED device called an active matrix OLED device is in active research. The active matrix OLED is formed, for example, by depositing an organic light-emitting layer and a cathode layer over a substrate with a thin film transistor array thereon. The thin film transistors are used for driving the light-emitting units inside the active matrix OLED device.

In general, an active matrix OLED device is a bottom emission device. Since the anode layer of the active matrix OLED device is made from a transparent material and the cathode layer is made from non-transparent metallic material, light produced by the organic light-emitting layer will emit from the bottom portion of the device. For this type of device, the gate of the thin film transistors is capable of blocking external light from getting into the channel layer through the backside of the substrate to cause photoelectric current leakage. Furthermore, to prevent light produced by the organic light-emitting layer from reaching the channel layer of the thin film transistors, the anode layer of the active matrix OLED device must be properly positioned with respect to the thin film transistor. In other words, the anode layer must not be positioned over the thin film transistors. Hence, the extent of the light-emitting area in each pixel structure is severely restricted.

However, even if the anode layer is not patterned over the thin film transistor, light produced by the organic light-emitting layer can still scatter into the channel layer leading to a photoelectric leakage current.

The aforementioned photoelectric leakage current often leads to a drift in the device's operating current. Ultimately, the gray scale of the device is affected, thus leading to a lower contrast. Moreover, the photoelectric leakage also causes the operating current of the device to increase with time. Consequently, not only is the working life of the device reduced, but the power consumption is correspondingly increased.

SUMMARY OF INVENTION

Accordingly, one object of the present invention is to provide a top emission active matrix organic light-emitting display (OLED) device and fabricating method thereof capable of reducing photoelectric leakage current.

A second object of the present invention is to provide a top emission active matrix organic light-emitting display (OLED) device and fabricating method thereof capable of providing a uniform current, extending the overall working life of the device.

To achieve these and other advantages and in accordance with the purpose of the invention, as embodied and broadly described herein, the invention provides a top emission active matrix organic light-emitting display (OLED) device. The OLED device includes a thin film transistor array, a passivation layer, a shielding layer, an anode layer, an organic light-emitting layer and a transparent cathode layer. The thin film transistor array includes a plurality of thin film transistors, a plurality of scan lines and a plurality of data lines. The passivation layer is positioned over the substrate covering the thin film transistor array. According to the present invention, the passivation layer can be a photoresistant layer with a planar surface, a dielectric material layer with a planar surface or a silicon nitride layer or a silicon oxide layer. The shielding layer is positioned over the substrate covering the passivation layer. The shielding layer is electrically connected to the thin film transistor. According to the present invention, the shielding layer is fabricated using a conductive material with reflective property including, for example, aluminum (Al), chromium (Cr) or molybdenum (Mo). The shielding layer is fabricated using a conductive material with absorption property including, for example, zinc oxide ($ZnO_x$), zinc sulfide (ZnS), germanium (Ge), cadmium telluride (CdTe), cadmium selenide (CdSe), antimony sulfide ($Sb_2S_3$), germanium nitride (GeN), praseodymium manganese oxide ($PrMnO_3$) or chromium and chromium oxide mixture ($Cr+CrO_x$). The anode layer is positioned over the shielding layer. The anode layer has a pattern identical to the shielding layer. The organic light-emitting layer is positioned over the anode layer and the transparent cathode layer is positioned over the organic light-emitting layer.

The present invention also provides a method for fabricating a top emission active matrix organic light-emitting display (OLED) device. A substrate is provided and then a thin film transistor array is formed over the substrate. The thin film transistor array includes a plurality of thin film transistors, a plurality of scan lines, and a plurality of data lines. A passivation layer is formed over the substrate covering the thin film transistor array. The passivation layer can be a planar photoresistant layer or a planar dielectric layer formed, for example, by spin coating. The passivation layer can also be a silicon nitride layer or a silicon oxide layer formed, for example, by conducting chemical vapor deposition. Thereafter, a shielding layer is formed over the passivation layer. The shielding layer is electrically connected to the thin film transistor. According to the present invention, the shielding layer is fabricated using a conductive material with reflective property including aluminum, chromium or molybdenum. The shielding layer can also be fabricated using a conductive material with absorption property including zinc oxide, zinc sulfide, germanium, cadmium telluride, cadmium selenide, antimony sulfide, germanium nitride, praseodymium manganese oxide or chromium and chromium oxide mixture. Afterwards, an anode layer is formed over the shielding layer. The anode layer and the shielding layer are patterned using an identical, mask. An organic light-emitting layer is formed over the anode layer. Finally, a transparent cathode layer is formed over the organic light-emitting layer to form a complete top emission active matrix OLED device.

The top emission active matrix OLED device according to the present invention includes a shielding layer underneath the anode layer. Hence, light traveling from the organic light-emitting layer into the channel layer of the thin film transistor is prevented from inducing a photoelectric leakage current.

In the presence of the shielding layer, the anode layer may extend along the shielding layer to cover the top portion of the thin film transistor, thereby leading to an increase in the overall light-emitting area of each pixel structure.

Furthermore, because the conductivity of a metallic shielding layer is better than an anode layer, the shielding layer is able to carry a highly uniform current and to increase the average working life of the device.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
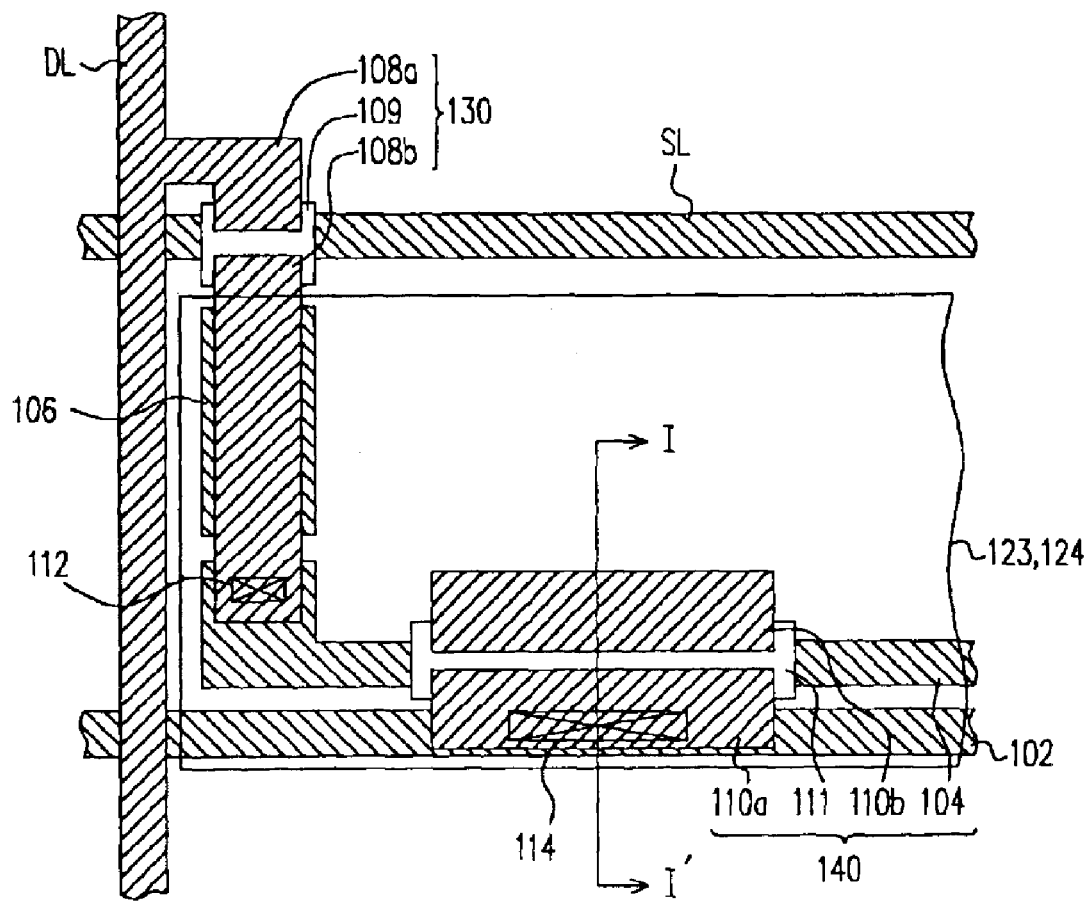
FIG. 1A is a schematic top view of a top emission active matrix organic light-emitting display device according to the first preferred embodiment of the present invention.

Reference will now be made in detail to the present preferred embodiments of the present invention, examples of which are in the accompanying drawings. Wherever possible, the same reference numbers are used in the drawings and the description to refer to the same or like parts.

Figure 1B:
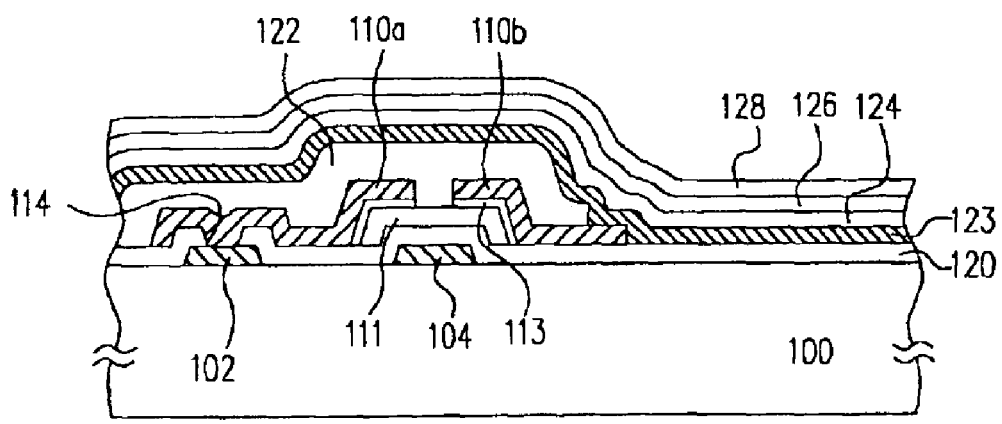
FIG. 1B is a cross-sectional view along line I–I" of the top emission active matrix OLED device as shown in FIG. 1A.

FIG. 1A is a schematic top view of a top emission active matrix organic light-emitting display device according to a first preferred embodiment of the present invention. FIG. 1B is a cross-sectional view along line I–I" of the top emission active matrix OLED device as shown in FIG. 1A. The top emission active matrix OLED device actually comprises an array of pixel structures. In the following illustration, only one of the pixel structures is described.

As shown in FIGS. 1A and 1B, a scan line (SL), a metal line 102, a gate 104 and a lower electrode 106 of a storage capacitor is formed over a substrate 100 to form a first metallic layer (M1).

A gate dielectric layer 120 is formed over the substrate 100 covering the first metallic layer (M1). The gate dielectric layer 120 is a silicon nitride layer or a silicon oxide layer, for example. Thereafter, openings 112 and 114 that expose the gate 104 and the metallic line 102 respectively are formed in the gate dielectric layer 120. Channel layers 109, 111 is formed over the gate dielectric layer 120. The channel layer 109 is formed over a portion of the scan line SL (later serving as a and the channel layer 111 is formed over the gate 104.

Source/drain terminals 108a/108b, 110a/110b are formed over the channel layers 109 and 111 respectively. Thereafter, a data line DL with electrical connection with the source terminal 108a is formed over the gate dielectric layer 120 to form a second metal layer (M2). The drain terminal 108b is electrically connected to the gate 104 through the opening 112 and the source terminal 110 is electrically connected to the metal line 102 through the opening 114. In addition, the drain terminal 108b is formed over the lower electrode 106. Hence, the drain terminal 108b simultaneously serves as the upper electrode of the storage capacitor. The gate dielectric layer 120 between the upper electrode 108b and the lower electrode 106 together serves as a capacitor dielectric layer.

In this embodiment, an ohmic contact layer 113 may be included between the source/drain terminals 108a/108b, 110a/110b and the channels 109, 111 to improve overall electrical contact. Hence, the portion of the scan line SL that serves as the gate, the source/drain terminals 108a/108b, the channel layer 109 and the ohmic contact layer 113 together constitute a thin film transistor 130 acting as a switch. The gate 104, the source/drain terminals 110a/110b, the channel layer 111 and the ohmic contact layer 113 together constitute another thin film transistor acting as a driver.

A passivation layer 122 covering the aforementioned structure is patterned to expose the drain terminal 110b of the thin film transistor 140. The passivation layer 122 is a silicon nitride layer, a silicon oxide layer or other dielectric material layer formed, for example, by conducting chemical vapor deposition.

Thereafter, a shielding layer 123 is patterned over the passivation layer 122. The shielding layer 123 is electrically connected to the exposed drain terminal 110b. The shielding layer 123 also extends to the area above the thin film transistors 130 and 140 or even extends into area over the scan line SL and the data line DL as long as each shielding layer 123 of each pixel structure is not connected to each other. In this embodiment, the shielding layer 123 is fabricated using a conductive material with reflective property (a material capable of reflecting light) including aluminum, chromium or molybdenum. The shielding layer 123 can also be fabricated using a conductive material with absorption property (a material capable of absorbing light) including zinc oxide, zinc sulfide, germanium, cadmium telluride, cadmium selenide, antimony sulfide, germanium nitride, praseodymium manganese oxide or chromium and chromium oxide mixture.

Next, an anode layer 124 is formed over the shielding layer 123. The anode layer 124 is patterned using the same mask for patterning the shielding layer 123. In other words, the anode layer 124 and the shielding layer 123 have an identical pattern. Hence, there is no need to fabricate another mask after patterning the shielding layer 124. In this embodiment, the anode layer 124 is fabricated using a material including, for example, indium-tin-oxide or indium-zinc-oxide.

Thereafter, an organic light-emitting layer 126 is formed over the anode layer 124 and then a transparent cathode layer 128 is formed over the organic light-emitting layer 126. The transparent cathode layer 128 is fabricated using a material including magnesium-aluminum alloy, preferably with a magnesium:aluminum ratio=10:1, or lithium fluoride. To increase the conductivity of the transparent cathode layer 128, indium-tin-oxide or indium-zinc-oxide material may be introduced into the transparent cathode layer 128.

When electrons and holes from the anode layer 124 and the transparent cathode layer 128 are combined inside the organic light-emitting layer 126, light emission mechanism is triggered to produce light. Because the transparent cathode layer 128 is made from a transparent material, light produced by the organic light-emitting layer 126 will emit from the top section of the device. In addition, since the shielding layer 123 is able to reflect or absorb light, light is prevented from passing out through the bottom section of the device.

The fabrication of a shielding layer 123 underneath the anode layer 124 also prevents light emitted from the organic light-emitting layer 126 from entering the channel layers 109 and 111 of the thin film transistors 130 and 140 to produce a photoelectric leakage current. In particular, due to the shielding of the shielding layer 123, the anode layer 124 and the shielding layer 123 may expand to cover the area above the thin film transistors 130 and 140 so that the light-emitting area of each pixel structure is increased. Furthermore, the anode layer is normally fabricated using a not so conductive indium-tin-oxide or indium-zinc-oxide material. Hence, the underlying metallic shielding layer 123 can serve as a highly conductive medium for carrying a highly uniform current from the drain terminal 110b and for extending the average working life of the device.

Figure 2A:
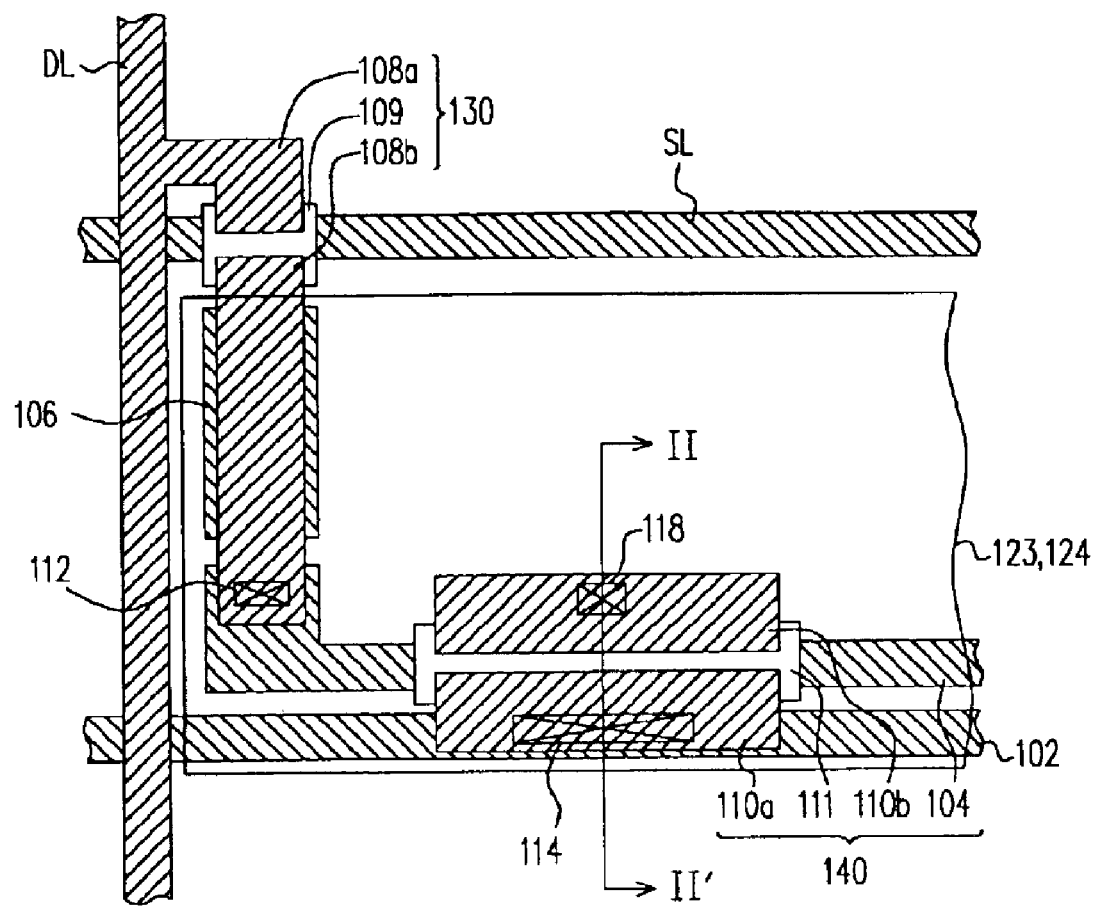
FIG. 2A is a schematic top view of a top emission active matrix organic light-emitting display device according to the second preferred embodiment of the present invention.
Figure 2B:
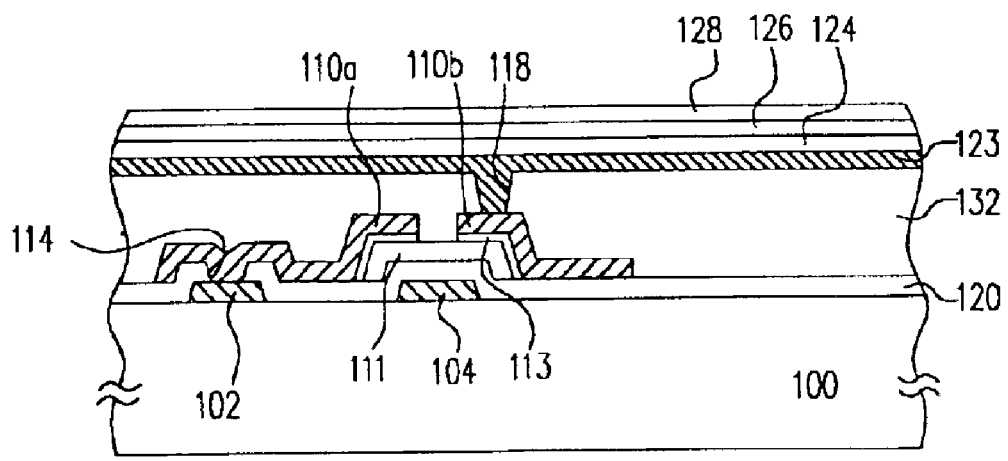
FIG. 2B is a cross-sectional view along line II–II" of the top emission active matrix OLED device as shown in FIG. 2A.

FIG. 2A is a schematic top view of a top emission active matrix organic light-emitting display device according to the second preferred embodiment of the present invention. FIG. 2B is a cross-sectional view along line II–II" of the top emission active matrix OLED device as shown in FIG. 2A. As shown in FIGS. 2A and 2B, one major difference from the first embodiment is the method for forming the passivation layer 132. In the second embodiment, the passivation layer 132 is formed in a spin-coating process and hence the passivation layer 132 is thin and flat. The passivation layer 132 is fabricated using photoresistant or dielectric material. After fabricating the passivation layer 132, an opening 118 is formed in the passivation layer 132 to expose the drain terminal 110b. Thereafter, a shielding layer 123 is patterned over the passivation layer 132. Some of the shielding material for forming the shielding layer 123 also fills the opening 118 to form a metallic plug structure. Through the metallic plug, the shielding layer 123 and the drain terminal 110b are electrically connected. The shielding layer 123 is fabricated with a material identical to the first embodiment.

Thereafter, an anode layer 124, an organic light-emitting layer 126 and a transparent cathode layer 128 are sequentially formed over the shielding layer 123. The steps and materials for forming these layers are identical to the ones in the first embodiment of the present invention.

The top emission active matrix OLED device comprises of a plurality of pixel structures organized into an array on a substrate 100. Each pixel structure includes a scan line SL, a data line DL, a switching device 130, a driving device 140, a distribution line 102, a passivation layer 122 (or 132), a shielding layer 123, an anode 124, an organic light-emitting layer 126 and a transparent cathode layer 128.

The scan line SL and the data line DL are positioned over the substrate 100. The data line DL extends in a direction that differs from the scan line SL. The switching device 130 is positioned over the substrate 100 such that the switching device 130 is electrically connected to the scan line SL and the data line DL. In this embodiment, the switching device 130 is a thin film transistor having a gate, a channel layer 109 and source/drain terminals 108a/108b. The gate is a portion of the scan line SL and the source terminal 108a connects electrically with the data line DL.

The driving device 140 is also positioned over the substrate 100 at a location to correspond with the switching device 130. The driving 140 and the switching device 130 are electrically connected. In this embodiment the driving device 140 is a thin film transistor having a 104, a channel layer 111 and source/drain terminals 110a/110b. The gate 104 and the drain terminal 108b of the switching device 130 are electrically connected through the contact 112.

The distribution line 102 is positioned over the substrate 100. The distribution line 120 extends in a direction parallel to the scan line SL. The distribution line 102 and the drain terminal 110a of the driving device 140 are electrically connected through the contact 114.

In the first preferred embodiment, the passivation layer 122 is positioned over the substrate 100 (as shown in FIG. 1B), covering the scan line SL, the data line DL, the switching device 130, the driving device 140 and the distribution line 102. Here, the passivation layer 122 is a silicon nitride layer or a silicon oxide layer. The passivation layer 122 exposes the drain terminal 110b of the driving device 140.

In the second preferred embodiment, the passivation layer 132 is positioned over the substrate 100 (as shown in FIG. 2B), covering the scan line SL, the data line DL, the switching device 130, the driving device 140 and the distribution line 102. Here, the passivation layer 132 is a planar photoresistant layer or a planar dielectric material layer.

The shielding layer 123 is positioned over the substrate 100 covering the passivation layer 122 (or the passivation layer 132). In one embodiment, the shielding layer 123 and the drain terminal 110b of the driving device 140 are electrically connected through direct contact between the shielding layer 123 and the exposed drain terminal 110b (as shown in FIG. 1B). In another embodiment, the shielding layer 123 and the drain terminal 110b of the driving device 140 are electrically connected through a metallic plug 118 through the passivation layer 132 (as shown in FIG. 2B). In addition, the shielding layer 123 extends to the area above the switching device 130 and the driving device 140 so that the switching device 130 and the driving device 140 are completely covered. The shielding layer 123 is fabricated using a conductive material with reflective or light absorbing property.

The anode layer 124 is positioned over the shielding layer 123. The anode layer 124 has a pattern identical to the shielding layer 123. In other words, the anode layer 124 also extends into the area above the switching device 130 and the driving device 140. Hence, the display device has a larger overall light-emitting area. The organic light-emitting layer 126 is positioned over the anode layer 124 and the transparent cathode layer 128 is positioned over the organic light-emitting layer 126.

Because the top emission active matrix OLED device of the present invention includes a shielding layer underneath the anode layer, light traveling from the organic light-emitting layer into the channel layer of the thin film transistor to induce a photoelectric leakage current is prevented.

The presence of a shielding layer also permits the anode layer to extend, along with the shielding layer, into the top portion of the thin film transistor, thereby leading to an increase in the overall light-emitting area of each pixel structure.

Furthermore, the conductivity of a metallic shielding layer is better than an anode layer and hence the shielding layer can be utilized to carry a highly uniform current thereby increasing the average working life of the device.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A top emission active matrix organic light-emitting display device, comprising:
   a thin film transistor array on a substrate, the thin film transistor array including a plurality of thin film transistors, a plurality of scan lines and a plurality of data lines;
   a passivation layer on the substrate covering the thin film transistor array;
   a shielding layer over the substrate covering the passivation layer, the shielding layer and the thin film transistors being electrically connected, and the shielding layer is conductive;
   an anode layer on the shielding layer, wherein the shielding layer has a pattern substantially identical to the anode layer;
   an organic light-emitting layer over the anode layer; and
   a transparent cathode layer over the organic light-emitting layer.

2. The display device of claim 1, wherein the shielding layer includes a conductive material layer with reflective property.

3. The display device of claim 2, wherein material constituting the conductive material layer with reflective property is selected from the group consisting of aluminum, chromium and molybdenum.

4. The display device of claim 1, wherein the shielding layer includes a conductive material layer with light-absorbing property.

5. The display device of claim 4, wherein material constituting the conductive material layer with light-absorbing property is selected from the group consisting of zinc oxide, zinc sulfide, germanium, cadmium telluride, cadmium selenide, antimony sulfide, germanium nitride, praseodymium manganese oxide, and chromium/chromium oxide mixture.

6. The display device of claim 1, wherein the transparent cathode layer is fabricated using a magnesium/aluminum alloy or lithium fluoride.

7. The display device of claim 6, wherein the transparent cathode layer further includes indium-tin-oxide or indium-zinc-oxide to enhance material conductivity.

8. The display device of claim 1, wherein the passivation layer includes a planar photoresistant layer or a planar dielectric material layer.

9. The display device of claim 1, wherein the passivation layer includes a silicon nitride layer or a silicon oxide layer.

10. The display device of claim 1, wherein the thin film transistors further include a plurality of driving thin film transistors and a plurality of switching thin film transistors such that the shielding layer and the driving thin film transistors are electrically connected.

11. A method for fabricating a top emission active matrix organic light-emitting display device, comprising the steps of:
    providing a substrate;
    forming a thin film transistor array over the substrate, the thin film transistor array including a plurality of thin film transistors, a plurality of scan lines, and a plurality of data lines;
    forming a passivation layer over the substrate covering the thin film transistor array;
    forming a shielding layer over the passivation layer, the shielding layer and the thin film transistors being electrically connected, and the shielding layer is conductive;
    forming an anode layer over the shielding layer, wherein the shielding layer and the anode layer are formed with the same mask;
    forming an organic light-emitting layer over the anode layer; and
    forming a transparent cathode layer over the organic light-emitting layer.

12. The method of claim 11, wherein the shielding layer includes a conductive material layer with reflective property.

13. The method of claim 12, wherein material constituting the conductive material layer with reflective property is selected from the group consisting of aluminum, chromium and molybdenum.

14. The method of claim 11, wherein the shielding layer includes a conductive material layer with light-absorbing property.

15. The method of claim 14, wherein material constituting the conductive material layer with light-absorbing property is selected from the group consisting of zinc oxide, zinc sulfide, germanium, cadmium telluride, cadmium selenide, antimony sulfide, germanium nitride, praseodymium manganese oxide, and chromium/chromium oxide mixture.

16. The method of claim 11, wherein the transparent cathode layer is fabricated using a magnesium/aluminum alloy or lithium fluoride.

17. The method of claim 16, wherein the transparent cathode layer further includes indium-tin-oxide or indium-zinc-oxide to enhance material conductivity.

18. The method of claim 11, wherein the passivation layer includes a planar photoresistant layer or a planar dielectric material layer fabricated in a spin-coating process.

19. The method of claim 11, wherein the passivation layer includes a silicon nitride layer or a silicon oxide layer fabricated in a chemical vapor deposition.

20. The method of claim 11, wherein the thin film transistors further includes a plurality of driving thin film transistors and a plurality of switching thin film transistors such that the shielding layer and the driving thin film transistors are electrically connected.

* * * * *